United States Patent [19]

Hennessey et al.

[11] 4,220,809
[45] Sep. 2, 1980

[54] PROTECTIVE MECHANISM FOR ELECTRONIC APPARATUS

[75] Inventors: William M. Hennessey, Somerville; Frederick E. Bratro, Scotch Plains, both of N.J.

[73] Assignee: Burroughs Corporation, Detroit, Mich.

[21] Appl. No.: 590

[22] Filed: Jan. 2, 1979

[51] Int. Cl.² ............................................. H05K 5/00
[52] U.S. Cl. ................................. 174/52 R; 174/58; 200/302; 248/222.4; 312/245
[58] Field of Search .................. 174/50, 52 R, 58, 48, 174/49; 220/3.9, 3.92; 361/331, 334, 356; 248/222.4, 223.1, 223.2; 200/302; 312/245

[56] References Cited

U.S. PATENT DOCUMENTS

| | | | |
|---|---|---|---|
| 2,862,997 | 12/1958 | Veitch et al. | 174/138 F |
| 3,486,610 | 12/1969 | Hain et al. | 312/245 |
| 3,967,085 | 6/1976 | Lockard et al. | 200/302 |

*Primary Examiner*—B. A. Reynolds
*Assistant Examiner*—D. A. Tone
*Attorney, Agent, or Firm*—Kevin R. Peterson; Robert A. Green; Edward J. Feeney, Jr.

[57] ABSTRACT

The disclosure is of electronic apparatus having a keyslot in its housing, by which it is coupled to a mounting screw. To protect the electronic circuitry inside the housing, the keyslot is covered internally by a layer of insulating paper and a thin metal sheet which overlies the paper and which is cemented to the surface of the housing adjacent to the keyslot. With this arrangement, the keyslot is accessible externally of the equipment for insertion of a screw; however, the inner circuit elements are completely and permanently sealed off from the outside world.

4 Claims, 4 Drawing Figures

PROTECTIVE MECHANISM FOR ELECTRONIC APPARATUS

BACKGROUND OF THE INVENTION

It is common practice to provide a keyslot in various types of apparatus, the slot being shaped to receive a mounting screw or the like, by which the apparatus can be secured to a support surface. This type of mounting arrangement is used in data processing equipment; however, in such equipment, it is necessary to cover the keyslot if it is of such size that foreign matter might fall through the keyslot and damage the inner circuit elements. Such a covering is also desirable to prevent possibly dangerous substances from falling out of the equipment, and it also prevents an individual from inserting a screwdriver or the like into the equipment and possibly being injured by high voltage. In some types of equipment, a knock-out piece might be provided which would cover the keyslot until it was used; however, if the equipment was later removed from its mounting, there would be no easy way to re-cover the opening to protect the inner circuitry.

The present invention solves this problem simply and inexpensively.

DESCRIPTION OF THE PREFERRED EMBODIMENTS

Figure 1:
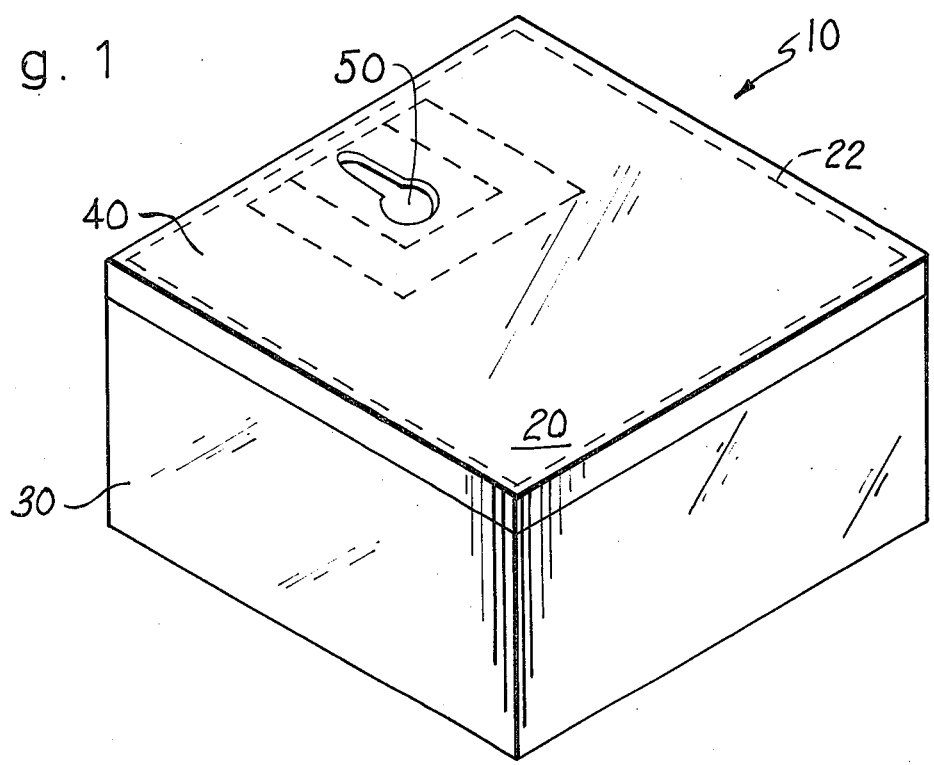
FIG. 1 is a perspective view of one type of electronic apparatus which might use the invention.
Figure 2:
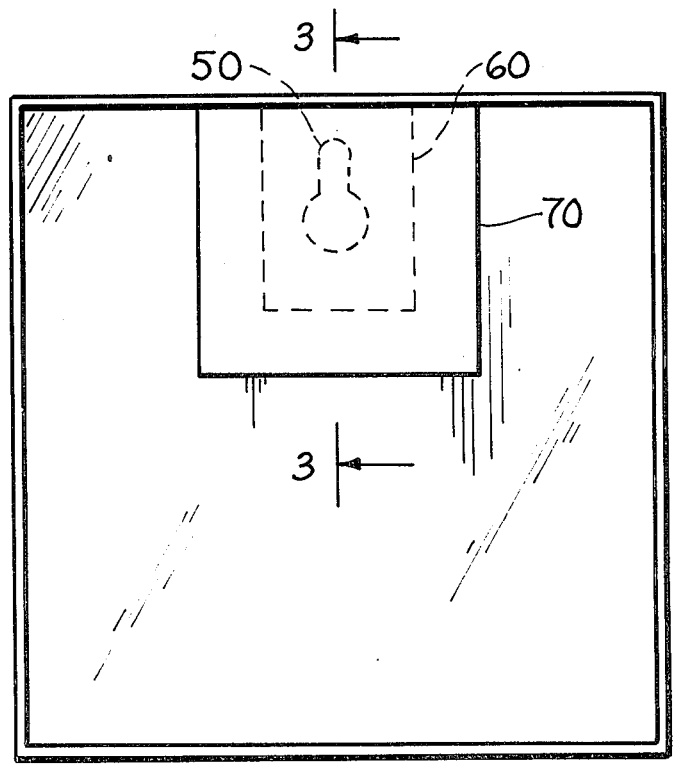
FIG. 2 is a bottom view of a portion of the apparatus of FIG. 1.
Figure 3:
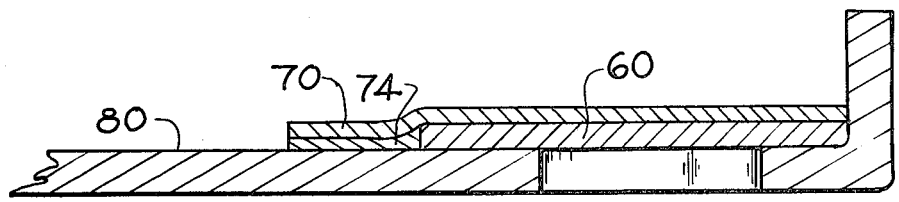
FIG. 3 is a sectional view along the lines 3—3 in FIG. 2.

The principles of the invention are described with respect to apparatus 10 which might constitute a piece of data processing equipment including a housing 20 made up of a first portion 30 in which electronic circuitry 22 might be mounted and a cover or base 40 therefor. The base or cover is provided with a keyslot 50, by means of which the apparatus 10 can be coupled to a mounting screw, as is well known in the art.

According to the invention, in order to block the keyslot 50 and prepare it for the desired usage, a sheet 60 of insulating material such as fish paper is placed over the opening on the inner surface 62 of the base. The sheet 60 is large enough to cover an area surrounding the keyslot. A thin sheet 70 of a relatively rigid material, for example, aluminum foil, is placed over the insulating sheet 60 and is cemented to the inner surface of the housing base. The sheet of metal foil 70 is larger in area than the insulating sheet 60, and its entire surface which extends beyond the insulating sheet is secured by a cement 74 to the base. A narrow strip along one edge 90 of sheet 70, which lies along the edge 100 of the base, is not cemented to the base to permit some movement of the sheets 60 and 70 when a screw is inserted in the keyslot.

Figure 4:
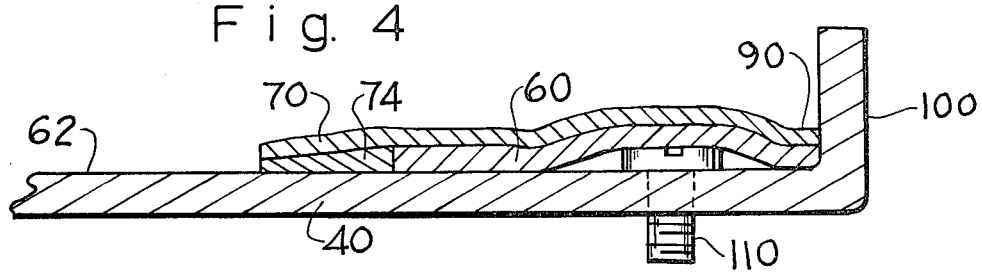
FIG. 4 shows the apparatus of FIG. 3 and illustrates one mode of operation of the invention.

In operation of the invention, when it is desired to mount the apparatus 10 on a mounting screw 110 (FIG. 4), it is pressed against the screw, and the screw forces the insulating sheet and the metal sheet slightly away from the inner surface of the base of the housing just enough to permit the screw to be set in place in the keyslot. This slight elevation of the cover sheets is permitted because edge 90 is not cemented to the cover plate. Later, if it is desired to demount the apparatus 10 by disengaging it from the screw, the metal strip 70 forces the insulating paper back down over the keyslot and again protects the interior of the equipment.

In addition to the advantages that can be readily seen from the above description of the invention, it is noted that the combination of foil and the paper hold the mounting screw tightly in place, and this arrangement would serve to prevent vibrations.

What is claimed is:

1. Electronic apparatus comprising
   a housing,
   electronic circuitry within the housing,
   a mounting plate as part of said housing, said plate having a keyslot and an inner surface and an outer surface, the inner surface of said plate facing the inside of said housing and the circuitry contained therein,
   a first sheet of insulating material on the inner surface of said plate and overlying and covering said keyslot, and
   a second sheet of relatively rigid material overlying said first sheet and secured to the inner surface of said plate along all but a portion of its periphery whereby said first and second sheets can be pushed slightly away from said inner surface,
   said first and second sheets forming a permanent blocking means for said keyslot whereby foreign objects cannot enter or leave said housing through said keyslot,
   said first and second sheets being sufficiently yieldable to permit a mounting screw to be inserted into said keyslot from outside said housing and pressing against said first sheet.

2. The apparatus defined in claim 1 wherein said second sheet is an aluminum foil.

3. The apparatus defined in claim 1 wherein said first sheet is of paper.

4. The apparatus defined in claim 1 wherein said second sheet is of aluminum foil and is generally rectangular in shape and has three of its sides secured to said inner surface.

* * * * *